United States Patent [19]
Schmitt et al.

[11] Patent Number: 5,356,673
[45] Date of Patent: Oct. 18, 1994

[54] EVAPORATION SYSTEM AND METHOD FOR GAS JET DEPOSITION OF THIN FILM MATERIALS

[75] Inventors: Jerome J. Schmitt, New Haven; Bret L. Halpern, Bethany, both of Conn.

[73] Assignee: Jet Process Corporation, New Haven, Conn.

[21] Appl. No.: 670,693

[22] Filed: Mar. 18, 1991

[51] Int. Cl.⁵ .................................. C23C 16/50
[52] U.S. Cl. .................... 427/446; 427/250; 427/255.1; 427/255.2; 427/255.5; 118/718; 118/723 ME; 118/723 MP; 118/726; 118/729; 118/730
[58] Field of Search ............... 118/715, 718, 723, 726, 118/729, 730, 723 R, 723 ME, 723 MP; 427/34, 38, 39, 248.1, 251, 255, 255.2, 255.5, 250, 255.1, 447, 449, 452, 453, 454, 455, 456, 446, 562, 563

[56] References Cited

U.S. PATENT DOCUMENTS

| | | | |
|---|---|---|---|
| 2,155,932 | 4/1939 | Davis | 427/255 |
| 3,850,679 | 11/1974 | Sopko et al. | 427/255.1 |
| 4,788,082 | 11/1988 | Schmitt | 427/248.1 |
| 4,957,061 | 9/1990 | Ando et al. | 118/723 |
| 4,957,062 | 9/1990 | Schuurmans et al. | 118/723 |
| 4,970,091 | 11/1990 | Buhrmaster et al. | 427/449 |
| 5,000,114 | 3/1991 | Yanagi et al. | 118/726 |

FOREIGN PATENT DOCUMENTS

| | | | |
|---|---|---|---|
| 47-12925 | 4/1972 | Japan | 118/730 |
| 63-28874 | 2/1988 | Japan | 118/723 |
| 64-33096 | 2/1989 | Japan | 427/34 |
| 1-100275 | 4/1989 | Japan | 118/723 |
| 1-179789 | 7/1989 | Japan | 427/34 |
| 1-292828 | 11/1989 | Japan | 118/723 |
| 899275 | 6/1962 | United Kingdom | 427/34 |

OTHER PUBLICATIONS

High Quality MNS Capacitors Prepared By Jet Vapor Deposition At Room Temperature by D. Wang, T. P. Ma, J. W. Golz, B. L. Halpern & J. S. Schmitt from IEEE Electron Device Letters, vol. 13, No. 9, Sept. 1992.

Nuccio, C. and R. N. Schiavone, "Enhancing Semiconductor Reactions", IBM Technical Disclosure Bulletin, vol. 12, No. 9 (Feb. 1970) p. 1433–1434.

*Primary Examiner*—Terry J. Owens
*Attorney, Agent, or Firm*—McCormick, Paulding & Huber

[57] ABSTRACT

A method and apparatus for depositing thin films of materials such as metals, oxides and nitrides at low temperature relies on a supersonic free jet of inert carrier gas to transport vapor species generated from an evaporation source to the surface of a substrate. Film deposition vapors are generated from solid film precursor materials, including those in the form of wires or powders. The vapor from these sources is carried downstream in a low pressure supersonic jet of inert gas to the surface of a substrate where the vapors deposit to form a thin film. A reactant gas can be introduced into the gas jet to form a reaction product with the evaporated material. The substrate can be moved from the gas jet past a gas jet containing a reactant gas in which a discharge has been generated, the speed of movement being sufficient to form a thin film which is chemically composed of the evaporated material and reactant gases.

39 Claims, 5 Drawing Sheets

EVAPORATION SYSTEM AND METHOD FOR GAS JET DEPOSITION OF THIN FILM MATERIALS

The invention described herein was made with U.S. Government support under contract No. DE-FG02-88ER13818 awarded by the Department of Energy. The Government has certain rights in this invention.

TECHNICAL FIELD

The present invention relates to the deposition of thin film materials, including metals, semiconductors, insulators, organics and inorganics, for applications in electronics, photonics and related fields and more particularly to a method and apparatus for gas jet assisted evaporation of thin films.

CROSS REFERENCE TO RELATED MATERIAL

Some of the subject matter herein is disclosed and claimed in the commonly owned U.S. Pat. No. 4,788,082 issued Nov. 29, 1988 and U.S. patent application Ser. No. 521,100, both incorporated herein by reference.

BACKGROUND OF THE INVENTION

The utility of high quality thin film materials for various applications are well known in the art. As reference, see for example "Deposition Technologies for Films and Coatings", by Rointon F. Bunshah, et al, 1982, Noyes Publications, Park Ridge, N.J., or "Thin Films from Free Atoms and Particles", edited by Kenneth J. Klabunde, 1985, Academic Press Inc., New York. There are several processes now used to prepare high quality thin film materials.

Chemical Vapor Deposition (CVD) produces a nonvolatile solid film on a substrate by the surface pyrolyzed reaction of gaseous reagents that contain the desired film constituents. A CVD process comprises the following steps, (1) gaseous reagent and inert carrier gas are introduced into the reaction chamber, (2) the gaseous reagent is transported by convection and diffusion to the surface of the substrate, (3) the reagent species are absorbed onto the substrate where they undergo migration and film forming reactions, and (4) gaseous by-products of the reaction and unused reagents are removed from the chamber. The pressure in the deposition chamber may be atmospheric or reduced as low as a fraction of 1 torr, as in respective the cases of Atmospheric Pressure CVD (APCVD) and Low Pressure CVD (LPCVD). The energy required to drive the reactions is supplied as heat to the substrate. For practical reaction rates, substrates are typically heated to temperatures ranging from 500° C. to as high as 1600° C. Consequently, heat sensitive substrates cannot be processed.

Energy can also be supplied by a radio frequency (RF) electric field which powers a gas discharge in the deposition chamber. This process is referred to as Plasma Enhanced CVD (PECVD). In PECVD, the substrate temperature may be lowered to 300° C. or lower. However the substrate is immersed in the discharge which can also lead to plasma damage of the substrate and film during growth.

The CVD deposition rate also depends on the local concentration of the gaseous reagent near the substrate surface. Gas phase mass-transfer by diffusion may limit deposition on the substrates' surface. Reagent concentration gradients may cause non-uniform deposition on the substrate surface as well. Increasing reagent partial pressures can lead to higher deposition rates. However, when reagent concentration is too high undesirable reaction and nucleation of solid particles in the gas phase occur. These particles then precipitate onto the substrate surface where they contaminate the growing film. This is especially true for PECVD.

It is always desirable to develop methods of film deposition which occur at lower temperatures and which avoid problems associated with plasma damage and gas phase nucleation of particles. In addition, it is desirable to have methods which avoid diffusional mass transport limitations. Moreover, certain CVD gases are highly toxic. Specifically, trained personnel with sophisticated equipment are required to safely handle toxic gases. It is therefore desirable to develop improved methods of depositing high quality thin films which do not rely on the use of toxic vapors.

Physical Vapor Deposition (PVD) includes the methods of evaporation (metalizing), sputtering, molecular beam epitaxy, and vapor phase epitaxy. These processes typically occur in a chamber evacuated to below 10-6 torr. At these rarified pressures, gas and vapor molecules or ions collide with the walls of the chamber more frequently than they do with one another. The desired film material is present in the chamber as bulk solid material. The material is converted from the condensed phase to the vapor phase using thermal energy (i.e. evaporation) or momentum transfer (i.e. sputtering). The vapor atoms or molecules travel line-of-sight as free molecular rays across the chamber in all directions where they condense on prepared substrates (and on the chamber walls) as a thin film. If the pressure becomes too high, collisions with gas molecules interfere with the vapor transport which therefore reduces the deposition rate. Sputtering can also cause undesirable plasma damage to the thin film and to the substrate.

Reactive evaporation and sputtering processes involve the intentional introduction into the chamber of oxygen, nitrogen or other reactive gas in order to form oxide, nitride or other compound thin films. Reactive gas pressure must be limited as mentioned above in order to avoid interfering with the transport of the depositing vapor molecules. When the pressure is too high, undesirable nucleation of particles in the gas phase can occur. The conventional reactive processes the material of the vapor source (e.g., the sputtering target or the hot crucible containing molten evaporant) itself can be contaminated by unwanted reaction with the reactive gas.

Liquid phase processes are also used to prepare thin film coatings. However, the quality of films produced is usually inferior to those prepared by the above methods due to contamination by impurities in the liquid source. Plasma or flame sprayed coatings are composed of solidified droplets of molten metals or ceramics; they are much thicker and coarser than vapor deposited coatings, and therefore are not considered to be thin films.

It is therefore desirable to have a thin film deposition method and apparatus which occur at higher pressure without diffusion governed transport limitations. It is also desirable to have techniques of reactive thin film deposition which occur at a high rate without contamination of a vapor source. The present invention is drawn towards such a method and apparatus.

SUMMARY OF THE INVENTION

An object of the present invention is to provide a method and apparatus of thin film deposition characterized by controlled thickness and stoichiometry at high rate and at low substrate temperature.

Another object of the present invention is to provide a method and apparatus of thin film deposition of the foregoing type having a jet of supersonic gas assist deposition of evaporated material onto a substrate.

Another object of the present invention is to provide a method and apparatus of thin film deposition of the foregoing type having multiple sources of thin film materials capable of alternately depositing monolayers of selected ones of said materials.

Another object of the present invention is to provide a method and apparatus of thin film deposition of the foregoing type having a replenishable supply of evaporant material.

According to the present invention, a system for depositing a film upon a substrate includes a vacuum chamber having a port allowing for access to a vacuum chamber interior and a positioning apparatus for locating a substrate within the vacuum chamber interior. A gas jet apparatus is affixed to the vacuum chamber port and has an interior cavity. The gas jet apparatus includes a mechanism for providing carrier gas to the gas jet apparatus interior cavity at a pressure greater than a vacuum chamber pressure and further includes a nozzle tip that extends into the vacuum chamber interior for providing a supersonic jet of gas directly to an outer surface of the substrate. The system also includes an evaporation device configured within the gas jet apparatus interior cavity that is registered with and displaced from the nozzle tip. The evaporation device evaporates material stored therein when heated. A pump evacuates gas from the vacuum chamber.

According to another aspect of the present invention, a system for depositing a film upon a substrate includes a vacuum chamber having a plurality of ports allowing for access to a vacuum chamber interior and a translation fixture for receiving the substrate positioned within the vacuum chamber interior and for moving the substrate between first and second positions. A first gas jet apparatus with an interior cavity is affixed to a first vacuum chamber port. The first gas jet apparatus includes a mechanism for providing carrier gas to the gas jet apparatus interior cavity at a pressure greater than a vacuum chamber pressure. A first gas jet apparatus nozzle tip at a distal end of said first gas jet apparatus extends into the vacuum chamber interior and provides, at the first position, a supersonic jet of gas directly to an outer surface of the substrate. A first evaporation device is configured within the first gas jet apparatus interior cavity registered with and displaced from the first gas jet apparatus nozzle tip for evaporating a first material stored therein. The system also includes a second gas jet apparatus having an interior cavity and affixed to a second vacuum chamber port. The second gas jet apparatus has a mechanism for providing carrier gas to the second gas jet apparatus interior cavity at a pressure greater than a vacuum chamber pressure. A second gas jet apparatus nozzle tip at a distal end of said second gas jet apparatus extends into the vacuum chamber interior and provides, at the second position, a supersonic jet of gas directly to the outer surface of the substrate. A second evaporation device is configured within the second gas jet apparatus interior cavity registered with and displaced from the second gas jet apparatus nozzle tip. The second evaporation device is for evaporating material stored therein. A pump evacuates gas from the vacuum chamber. The translation fixture further moves the substrate between the first and second positions, within a time less than a time needed to complete film formation on the substrate, thereby ensuring that a film deposited on the substrate is chemically comprised of chemical reaction products of the first and second materials.

DESCRIPTION OF THE PREFERRED EMBODIMENT

Figure 1:
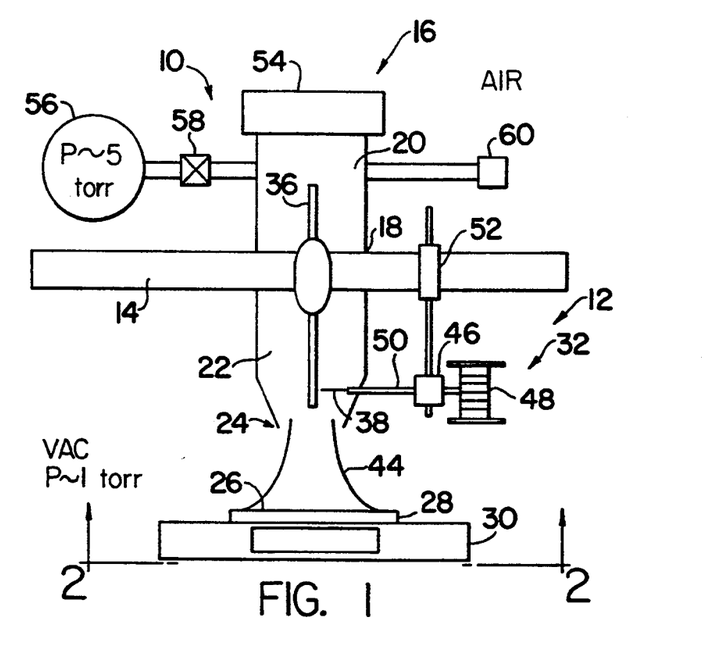
FIG. 1 is a simplified side illustration of an evaporation gas jet deposition apparatus provided according to the present invention.

Referring to FIG. 1, an evaporation gas jet deposition system 10 includes a vacuum chamber 12 of a known type is evacuated by a pump (not shown). The vacuum chamber is comprised of a wall 14 of metal or glass, only a portion of which is shown. In the several Figures, "air" indicates the chamber exterior at atmospheric pressure and "vac" denotes the evacuated interior. In the preferred embodiment, the pump is of the roots blower/rotary vane type having a rate volumetric speed of 20,000 liters per minute. Prior to any deposition, this pump is used to evacuate the chamber to a base pressure of 5 millitorr. This pressure has been adequate to produce high purity films and avoids the need for costly, high vacuum equipment and procedures. As descred hereinafter, carrier gas flow rate can be as high as 20 standard liters per minute. The pumping speed, and therefore the pressure in the vacuum chamber, is regulated by means of a throttle valve (not shown) on the pump inlet.

A gas jet apparatus 16 is configured on a flange at a port 18 of the vacuum chamber wall. The apparatus 16 includes a cylindrical nozzle 20, constructed of glass, metal or ceramic material (e.g.; copper, steel and boron-nitrite), that has an interior cavity 22 and which is fitted into the flange. The nozzle extends partially into the vacuum chamber interior and preferably has an exit or tip 24 diameter ranging from 5 mm to 1 cm. The nozzle exit is positioned a select distance from an upper surface 26 of a substrate 28 mounted on a substrate holder 30. The nozzle is made of glass, metal, ceramic or other suitable vacuum compatible material.

As detailed hereinafter, the magnitude of the nozzle exit—substrate surface separation is selected in accordance with several parameters, including the evaporant material and carrier gas pressure. It is important that the separation not be so great as to extend the time of flight beyond a time in which particulates in the gas phase are formed. Deposition from a circular nozzle results in a localized (usually circular) deposit on the substrate surface. Nozzles of differing shape accordingly produce other, desired deposition patterns.

Figure 2:
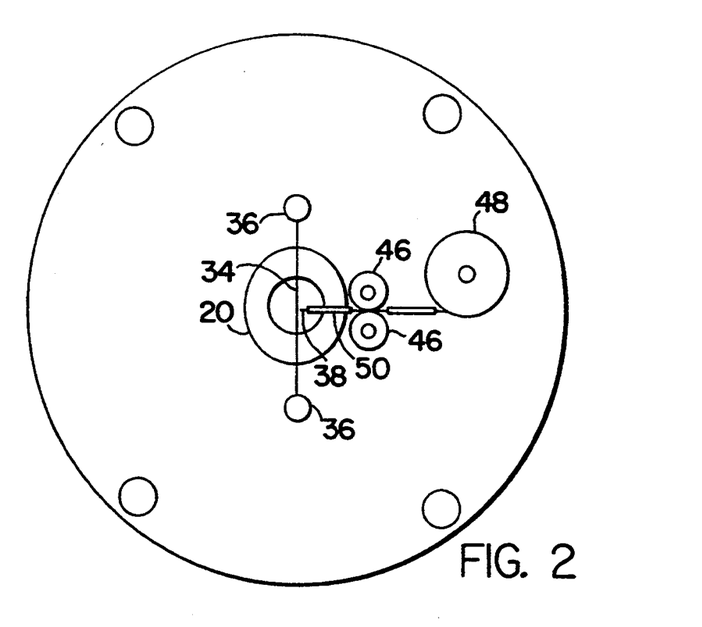
FIG. 2 is a bottom plan view of the evaporation gas jet deposition apparatus of FIG. 1.

An evaporation apparatus 32 consists preferably of a refractory metal filament (34, FIG. 2) (e.g.; tungsten wire 1 mm in diameter) which is positioned near the nozzle exit and within the nozzle interior cavity. The filament is heated by electricity supplied through vacuum-tight electric current feedthroughs 36. As seen in FIG. 2, evaporant in the form of fine metal wires 38 (e.g. 0.25 mm in diameter) is fed onto the filament. When heated, the tip of the fine wire is urged into contact with the hot surface of the filament, causing it to melt, wet the filament, and vaporize. The refractory metal filament may have a ceramic sleeve or liner, such as aluminum oxide ($Al_2O_3$) or boron nitride (BN) to protect it from corrosion by the molten metal evaporant. For example, molten aluminum and platinum react with all the refractory metals, and some prophylactic measures must be used.

The evaporation apparatus 32 comprises two opposed rollers 46 which drive the fine wire evaporant from a spool 48 through a fine steel hypodermic tube 50 onto the hot filament. The rollers are made of either steel or VITON, and they are rotated by means of a vacuum rotary motion feedthrough 52 sealed by either an "O"-ring or bellows and powered by an external stepper motor (not shown). Support mechanisms associated with apparatus 32 are conventional and have not been illustrated for purposes of clarity. The incandescent filament can be monitored and its temperature measured pyrometrically via an upstream viewport 54. Vapor from the source is entrained in the high speed carrier gas flow and swept in the jet downstream onto the substrate surface where vapor condensation and film growth occur. The deposition rate can be controlled by regulating the rate at which the source is replenished. The high local rates of deposition permit practical processing of large areas of substrate. Also, monolayers of surface film over large substrate areas can be sequentially fabricated by precise control over the parameters of deposition.

Figure 3:
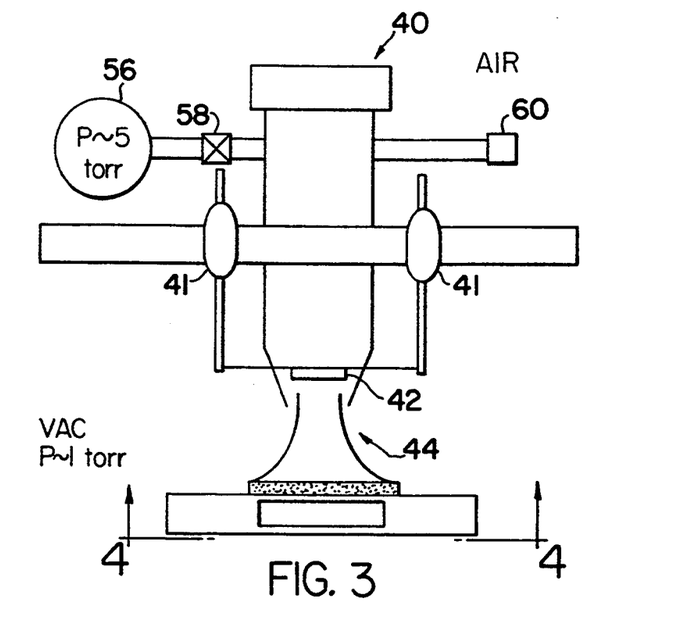
FIG. 3 is a simplified side illustration of an alternative evaporation gas jet deposition apparatus provided according to the present invention.
Figure 4:
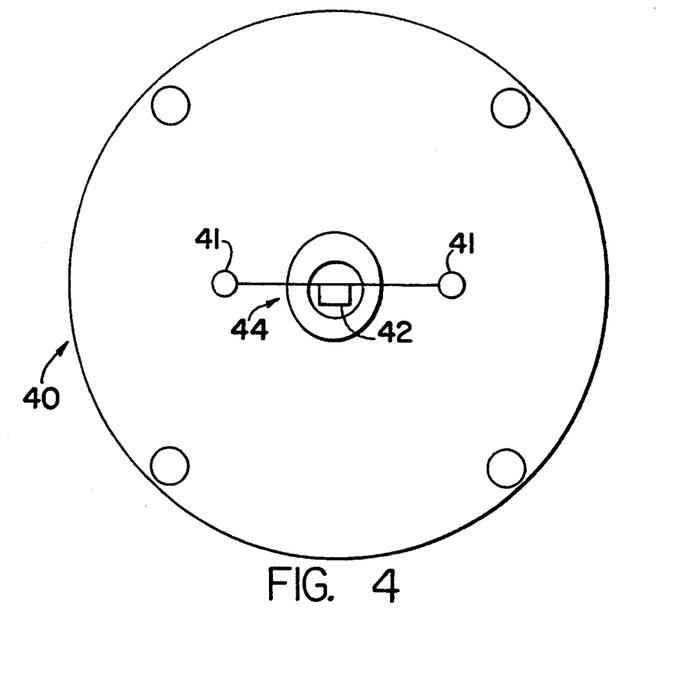
FIG. 4 is a bottom plan view of the evaporation gas jet deposition apparatus of FIG. 3.

An alternative embodiment 40 to the evaporation apparatus 32 is shown in FIGS. 3 and 4 and comprises an electrically heated boat or crucible 42 made of refractory metal foil, or equivalently a ceramic crucible wrapped with refractory metal or foil. A charge of evaporant 44 in the form of fine powder is placed in the crucible. When the crucible is heated, the charge melts and then evaporates. Those skilled in the art will note that it is sometimes desirable to premelt and degas the powder charge at lower temperature prior to evaporation and deposition. The powder charge can be replenished during the process by means of a mechanical powder feed device (not shown) which is also powered by means of a vacuum motion feedthrough. The temperature of the crucible may be monitored with a thermocouple, also not shown. In other aspects the alternative evaporation apparatus 40 is the same as apparatus 32 with appropriate modifications to the electrodes 41 and other equivalent components.

To deposit films with the present invention, a flow of purified carrier gas such as helium, hydrogen or argon, begins in a high pressure cylinder 56, and is provided through metering valve 58, into the vacuum chamber, and is pumped out by a high speed mechanical vacuum pump as noted above. The carrier gas is provided into the nozzle upstream of the evaporant and is established prior to heating. As noted above, the directed movement of the gas molecules at supersonic speeds through the nozzle exit is used to direct the evaporant entrained in the carrier gas to the substrate surface. To ensure that a maximum amount of evaporant is entrained by the carrier gas flow, the evaporant wire or crucible is positioned just inside the nozzle exit. This relative position also minimizes the amount of material deposited on peripheral surfaces, such as the viewport and thereby provides an additional benefit of lower maintenance and contamination. The entire evaporation apparatus, including nozzle, filament, feedthroughs, connections for gas supply and pressure measurement 60, viewport, wire spool, and wire drive mechanism are mounted and sealed on a brass or steel flange. An example of an evaporant is a material including at least one organometallic compound.

The flux of depositing vapor is highly directional and intense.

Figure 5:
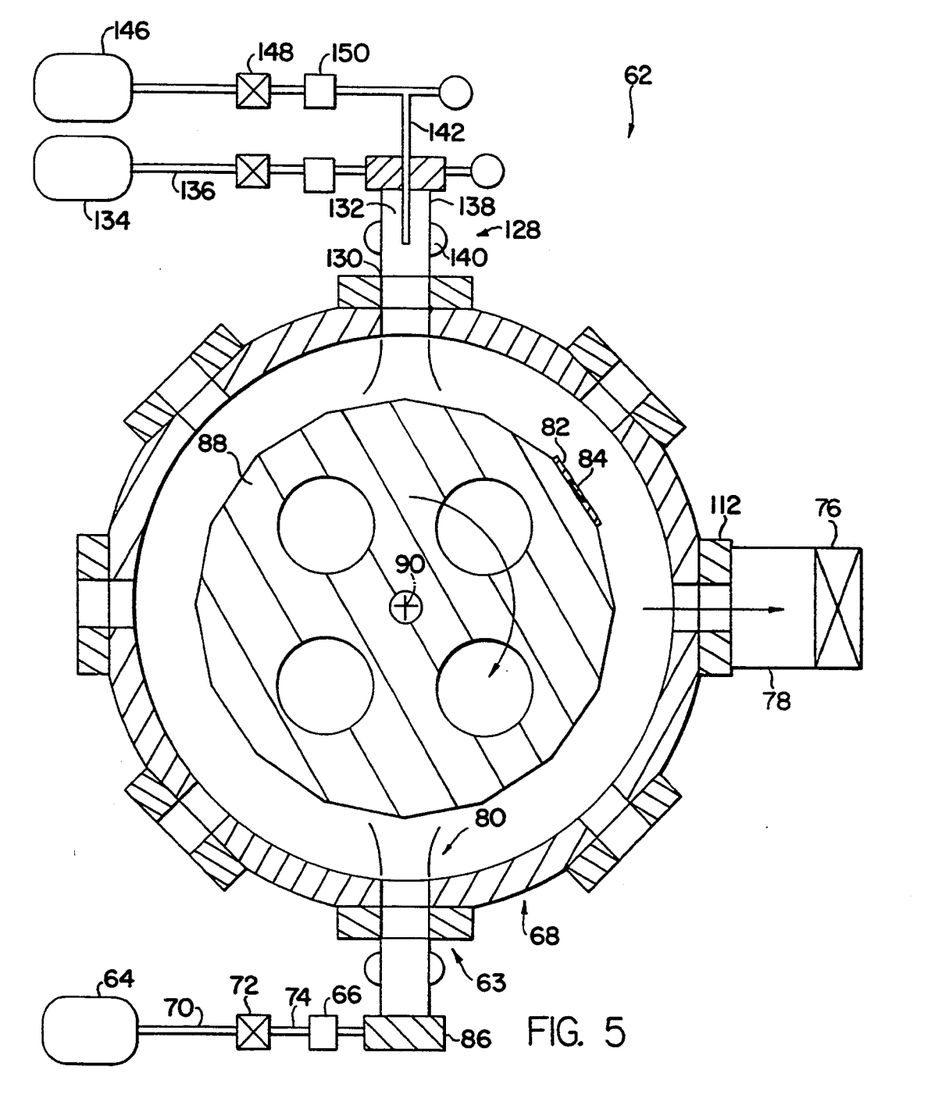
FIG. 5 is a schematic illustration showing a top view of an evaporation gas jet deposition system provided according to the present invention.

Referring now to FIG. 5, there is schematically shown an alternative evaporation gas jet deposition system 62 provided according to the present invention having an evaporation apparatus 63 as detailed above. A flow of purified carrier gas such as helium, hydrogen or argon, begins in a high pressure cylinder 64 and is provided through a nozzle 66, into the vacuum chamber 68 and then is pumped out by a high speed mechanical vacuum pump (not shown). Prior to deposition, the vacuum chamber is evacuated to a base pressure of 5 millitorr. Under typical process conditions, the carrier gas flow rate can be as high as 20 standard liters per minute. The high flow rate of purified carrier gas prevents "backstreaming" of fluids from the pump.

Gas supply line 70 is fitted with a valve 72 to regulate the gas pressure and flow rate in the nozzle which is measured with a manometer 74. The gas supply line is fitted with particle filters and purifiers (as needed) to insure purity and cleanliness. The pumping speed, and therefore the pressure in the vacuum chamber, is regulated by means of a throttle valve 76 on the pump inlet 78. The carrier gas flow rate is adjusted so that the pressure in the nozzle and in the chamber is of order 1 Torr. This pressure is also ideal for establishing microwave discharge plasmas in order to "reactively" deposit film materials.

By adjusting the flow rate, the pressure in the nozzle is maintained at least twice the pressure in the vacuum chamber; approximately 5 torr in the nozzle and 1 torr downstream in the chamber. The expansion of gas through the nozzle reaches sonic speeds ($10^5$ cm/sec. for helium at room temperature) and forms a supersonic gas jet 80 in the vacuum chamber.

A prepared substrate 82, which may be comprised of virtually any material, is placed in the vacuum chamber so that the gas jet impinges on upper surface 84. The upper surface of substrates such as glass, quartz, silicon, silicon dioxide, phosphate glass, gallium arsenide, metals, ceramics, polytetrafluoroethylene, carbon fiber, plastics, and indium phosphide are precleaned by techniques well known in the art. Pre-deposition cleaning and surface etching in-situ can also be accomplished with plasma reactive species supplied by auxiliary gas jet apparatus of the type detailed in the above referenced U.S. patent application.

With the present invention, the vaporized material is entrained in the high speed jet and carried to the substrate surface placed a few centimeters downstream of the nozzle exit. Under typical operating conditions where the jet is supersonic, this corresponds to a time-of-flight for the depositing vapor molecules of a few tens of microseconds. This short time minimizes the possibilities for gas phase nucleation of particles. Nucleation of solids occurs primarily on the substrate surface. The rate of vapor deposition and the integrated total flux of vapor can be controlled simply by adjusting the speed of the spool. Deposition thickness is controlled by halting the spool after a specified length of wire has been consumed.

Note that with the present apparatus, a viewport (86, FIG. 5) upstream of the vapor source is shielded from the vapor flux and always remains clear and uncoated since vapors and reactive species in the deposition chamber cannot diffuse upstream to the source. The gas jet shields the source and the deposition zone from contamination. This insures that the hot source remains clean and corrosion free even if a reactive gas is introduced downstream. Consequently, it is easy to implement plasma-activated, reactive deposition processes (as explained below) without corrosion and degradation of the metal vapor source. As is well known, "backstreaming" of pumping fluids can cause contamination of film materials in other deposition processes, especially those which rely on oil diffusion pumps to achieve high vacuum. However with the present invention, the large gas flow rates at relatively high pressures prevent pump oils and other contaminants from migrating upstream from the pump stack.

Deposition on the substrate is most intense at the center of the area on the substrate surface where the gas jet impinges. This can produce a deposit of non-uniform thickness; thickest in the middle and thinner at the edges. By "scanning" the jet across the substrate or by moving the substrate past a stationary gas jet this non-uniform deposition can be averaged to produce a thin film of uniform thickness. The apparatus of FIG. 5 is characterized by a carousel 88 on which a plurality of substrates are mounted. The carousel is rotatable about an axis 90 and allows the substrates to be repeatedly "scanned" past the stationary gas jet in order to produce a uniform deposition vs. time profile over the entire area of substrates. Highly uniform coatings over multiple substrates are readily obtained.

Figure 6:
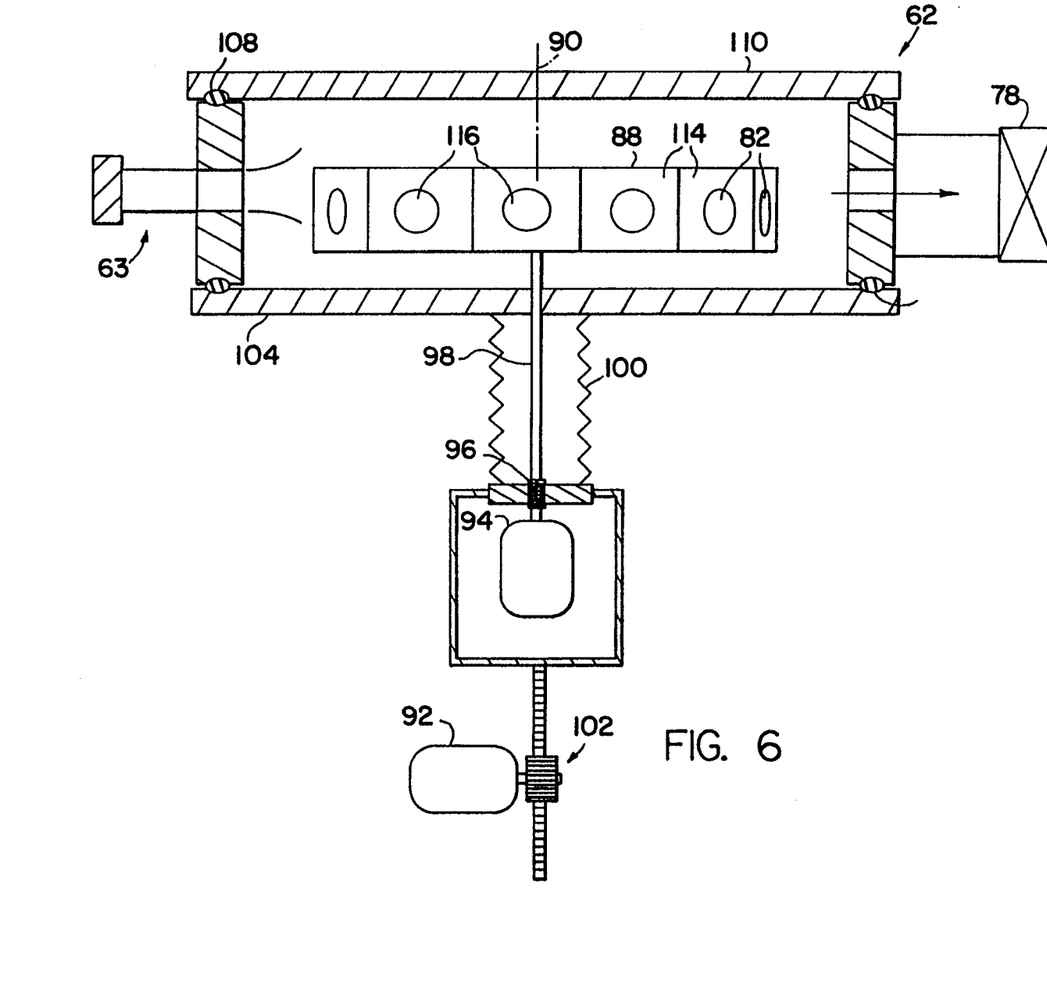
FIG. 6 is a side view of the evaporation gas jet deposition system of FIG. 5.

As shown in FIGS. 5 and 6, the carousel is cylindrical as well as polyhedral and is translatable along the axis of rotation. Motive power for rotation and translation is delivered by two external stepper motors 92 and 94, respectively. Rotary motion is provided to the vacuum chamber by means of a vacuum-sealed feedthrough 96 of a type well known in the art, and delivered to carousel via a drive shaft 98. Translation is accomplished by means of a bellows 100 actuated by the motor 94 and rack and pinion mechanism 102.

In the system of FIGS. 5 and 6, the vacuum chamber is a 50 cm diameter cylindrical aluminum chamber with 3.54 cm thick walls and has eight ports spaced equidistant around its circumference. The vacuum chamber also comprises a 2.54 cm thick aluminum baseplate 104. The vacuum chamber is sealed with O-rings 106,108. Either a top-plate 110 or a bell jar (not depicted) is also included. Port 112 is used as a pumping port and is closed by valve 78. The carousel is made of aluminum and is shaped like a cylindrical polygon 35 cm across and 1 cm thick with 18 flat sides each 6 cm in length. Square plates, 114, 6 cm $\times$ 6 cm $\times$ 3 mm are attached to each of the eighteen sides. Substrates 116 (e.g.;. 2" silicon wafers or 2" square glass slides) are held in pockets precisely machined into the plates so that the upper substrate surface is exposed. Springs (not shown) apply pressure on the backside of the substrates to hold them in place. The total substrate area exposed to the gas jet flux is therefore 18 $\times$ 6 cm $\times$ 6 cm = ca. 650 cm$^2$.

Typical motion/process parameters are rotation rate: 2 revs./sec., scan rate: 12 cm/min., scan length: 6.5 cm, number of scan "passes" back-and-forth: 40, total run time: 15 min., deposit thickness: 150 nm., deposit area: 650$^2$ cm (see above). Note that at the rotation rate noted above, the carousel will have completed 1800 rotations during the run. Consequently, the process, on average, deposits less than 0.1 nm of film thickness (one monolayer) per rotation. By careful control of deposition rate, and run time, it is possible to control film thickness at near monolayer resolution. Deposition rates can easily be reduced or increased from the above cited figure, or higher rates of carousel rotation can be employed (e.g.; greater than 100 Hz). A substrate translation fixture can include a device for heating the substrate and can include a surface for mounting the substrate substantially perpendicular to a direction of a reagent gas jet and rotatable about an axis substantially parallel to the substrate plane.

Also shown schematically in FIG. 5 is an auxiliary microwave plasma assisted reactive gas jet deposition apparatus 128 similar to that disclosed and claimed in the above referenced co-pending U.S. patent application. The apparatus 128 is comprised of a cylindrical nozzle 130 with an interior cavity 132. The nozzle is made from quartz, glass or other suitable dielectric. The exterior of the apparatus 128 is adapted to receive carrier gas from a high pressure reservoir 134 and provide it to the nozzle by means of tube 136. The preferred nozzle is comprised of a PYREX tube, 2.54 cm outer diameter, 2 mm wall thickness and is lined on the inside with a close fitting thin wall quartz tube 138. The quartz tube prevents the heat of a gas discharge from volatilizing any sodium impurity atoms presents in the PYREX, thereby preventing sodium contamination of the thin film deposit. The exit portion of the nozzle is surrounded by a microwave cavity 140. A plasma is created in the manner disclosed in the aforementioned co-pending U.S. patent application Ser. No. 521,100. The plasma is created in a carrier and reactant gas only in a portion of the outer nozzle interior cavity extending from approximately the inner nozzle tip toward the vacuum chamber. This microwave cavity may be of the Evenson type and is powered via a coaxial cable from a remote microwave power supply (not shown). A controlled flow of reactive gas from cylinder 146 via valve 148, filter 150 and tube 142 is presented by the auxiliary apparatus. The reactive gases include, but are not limited to, oxygen, nitrogen, nitrous oxide, ammonia SiH$_4$, SiH$_2$Cl$_2$, SiCl$_4$, SiF$_4$, WF$_6$, TiCl$_4$, BCl$_3$, B$_2$H$_6$, GeH$_4$, AsH$_5$, C$_2$H$_2$, W(CO)$_6$, and an organometallic vapor.

The auxiliary gas jet apparatus 128 can be affixed to a supplemental port on the vacuum chamber and can source plasma activated oxygen or nitrogen atoms and molecules produced by flowing either oxygen, nitrogen, ammonia or nitrous oxide. As noted above, the process parameters can be adjusted so that films of monolayer thickness can be deposited per rotation of the substrate carousel. Consequently, as each monolayer of film is deposited, it can be treated with activated reactive molecules and atoms supplied by the auxiliary gas jet in order to convert the film immediately upon deposition into an oxide or nitrite material. The energy for the film forming reactions is supplied upstream in the plasma; consequently, the reaction at the substrate can occur at low temperature. The substrate does not pass through the discharge itself, thereby avoiding plasma damage. Those skilled in the art will note that the system of FIG. 5 can be configured with one or more gas jet apparatus of the types disclosed hereinabove. Therefore, the film composition formed on the substrate is a function of the selected constituent elements, the type of gas jet apparatus and their respective locations about the periphery of the vacuum chamber. Note further that if the auxiliary gas jet apparatus is to be used with gases such as silane which can yield condensible molecular fragments, the preferred structure would be of the type detailed in the above referenced '100 U.S. patent application.

Figure 7:
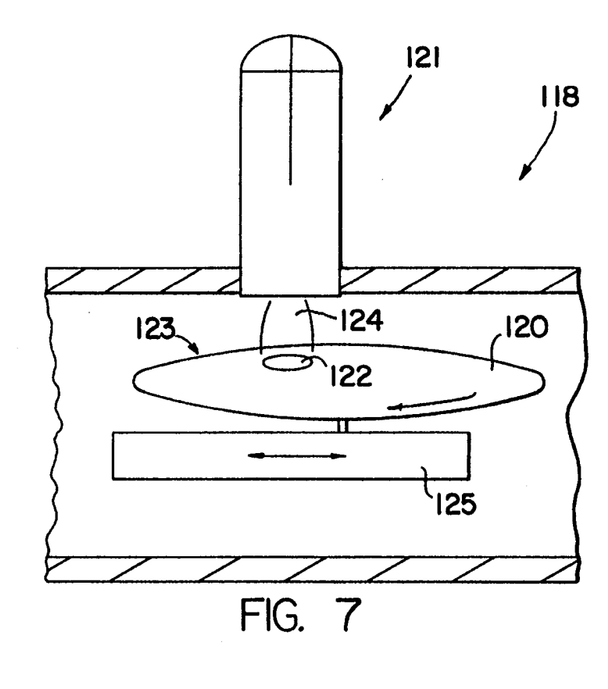
FIG. 7 illustrates a substrate carrousel for use with the present invention.
Figure 8:
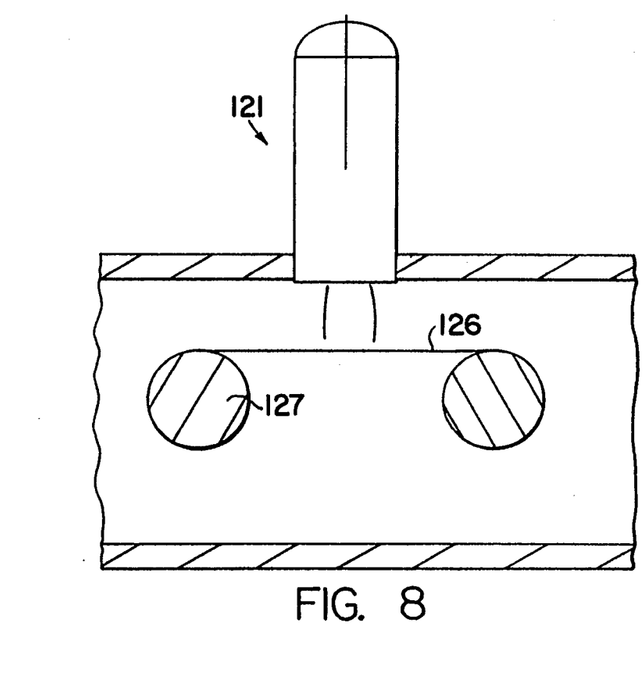
FIG. 8 illustrates a substrate holder for use with the present invention.

An alternative substrate carousel 118 which employs a disc 120 rotating at a constant rate is shown schematically in FIG. 7 in registration with an evaporation apparatus 121. Substrates 122 are mounted on the flat surface of the disc. This surface is exposed to a jet deposition source aimed at the plane upper surface 123 of the spinning disc. The disc surface is "scanned" past a gas jet 124 not unlike the way a phonograph stylus scans across the surface of phonograph record during play. The scanning is controlled in a stepwise fashion by a scanner 125 that accounts for the change in the radius of rotation, so that each portion of the disc surface (i.e., unit area) is exposed to the constant deposition flux for an equal amount of time in a manner similar to that described above for the cylindrical carousel; resulting in a thin film deposit of uniform thickness across the disc. If, as in FIG. 8, the substrate is a fiber, a wire or web 126, then it may be passed from a roll or spool 127 through one or more jets, where it receives a thin coating of uniform thickness, and then onto a take-up spool. A substrate translation apparatus can include a mechanism for rastering the substrate positioning apparatus with respect to a nozzle tip, thereby presenting substantially all of the substrate surface to be in registration with the nozzle tip.

Although the process occurs at relatively high pressure, the flow of highly purified carrier gas continuously purges the chamber of background vapors and particles which otherwise could contaminate the growing film. Furthermore, pump oils cannot stream back from the mechanical pump to contaminate the deposition chamber. The jet shields the deposition zone from contamination and high purity films can be produced.

A system provided according to the present invention can be used to prepare high quality thin films of the following materials:

| | |
|---|---|
| Metals: | Au, Cu, Ag, Pt, Pd, In, Sn, Pb, Al, Ti, Ni, Cr, Ta, Mo, Zr, and W |
| Oxides: | Si, Ti, Ta, Zr, W, Cu, Pb, and Au |
| Nitrides: | Si, Al, and Ti |
| Semiconductors: | Amorphous Si and Se, and Cds |
| Organics: | Anthracene, phthalocyanine, pyrene, rhodamine |

The metal films appear highly reflective and mirror-like. The measured electrical conductivity of metal film samples approaches the corresponding bulk values. Optical reflectivity of a gold film made in accordance with the present invention is as reflective as the highest quality films produced by conventional PVD, even though the sample was produced in an environment having a million times higher pressure than is typical of the PVD process.

As noted above, the present invention can utilize multiple evaporation gas jet apparatus, each providing a different material. When operated simultaneously, alloy and compound thin film materials can be produced. When operated in sequence, multilayer deposits result. The vapor flux from the wire fed sources can be started and stopped virtually instantaneously by simply turning the drive motor on or off. This feature creates sharp interfaces between layers of differing materials. By initializing operation of a subsequent gas jet apparatus immediately after a first one is extinguished, the first deposited film is immediately coated with material from the second source before there is a reaction with residual contaminant vapors in the chamber. A very clean interface between layers is the result. With the present invention, surface reaction of metal films monolayer-by-monolayer during deposition can produce fully oxidized or nitridized films without the need for reactive species to diffuse through a solid layer. Alternatively, the gas jet flux can be gradually reduced by slowing the drive motor while the flux from a second vapor source is gradually increased; yielding a graded interface between differing materials.

Similarly, although the invention has been shown and described with respect to a preferred embodiment thereof, it should be understood by those skilled in the art that various other changes, omissions and additions thereto may be made therein without departing from the spirit and scope of the present invention.

We claim:

1. A system for depositing a film upon a substrate, said system comprising:

a vacuum chamber having a port allowing for access to a vacuum chamber interior, a positioning apparatus for locating a substrate within said vacuum chamber interior;

a gas jet apparatus affixed to said vacuum chamber port and having an interior cavity, said gas jet apparatus including a means for providing carrier gas to said gas jet apparatus interior cavity at a pressure greater than a pressure in said vacuum chamber and including a nozzle tip extending into said vacuum chamber interior for providing a supersonic jet of gas directly to an outer surface of said substrate;

an evaporation means including feed means for controllably supplying first material to a heat source for evaporation at a rate of supply corresponding directly to a rate of film growth, said evaporation means configured within said gas jet apparatus interior cavity registered with and inwardly displaced from said nozzle tip into said gas jet apparatus interior cavity; and a pump means for evacuating gas from said vacuum chamber.

2. The system of claim 1 wherein said heat source comprises a heated filament and said feed means comprises an apparatus for feeding wire-shaped material to said heated filament.

3. The system of claim 1 wherein said nozzle tip is in registration with and at a selected distance from a substrate upper surface.

4. The system of claim 1 wherein said evaporation means comprises an electrically heated crucible.

5. The system of claim 1 wherein said nozzle tip is circular.

6. The system of claim 1 wherein said nozzle tip has a substantially elongated cross sectional profile.

7. The system of claim 1 further comprising a translation apparatus for moving said substrate between a first and a second position.

8. The system of claim 7 wherein said translation apparatus further comprises a mechanism for rastering said substrate positioning apparatus with respect to said nozzle tip, thereby presenting substantially all of said substrate surface to be in registration with said nozzle tip.

9. The system of claim 1 further comprising:
   a second gas jet apparatus affixed to said second vacuum chamber port and having an interior cavity, said gas jet apparatus including a means for providing carrier gas to said gas jet apparatus interior cavity at a pressure greater than a pressure in said vacuum chamber and including a nozzle tip extending into said vacuum chamber interior for providing, at a second position, a supersonic jet of gas directly to an outer surface of said substrate;
   an evaporation means including feed means for controllably supplying a second material to a heat source for evaporation at a rate of supply corresponding directly to a rate of film growth, said evaporation means configured within said gas jet apparatus interior cavity registered with and inwardly displaced from said nozzle tip into said gas jet apparatus interior cavity;
   a translation fixture for moving said substrate between first and second positions within a time less than a time needed to complete film formation on said substrate, thereby ensuring that a film deposited on said substrate is chemically comprised of chemical reaction products of said first and second materials.

10. The system of claim 7 wherein said translation apparatus further comprises a carrousel means within said vacuum chamber for receiving a plurality of substrates and sequentially presenting outer surfaces thereof to receive said supersonic gas jet.

11. The system of claim 1 wherein said first material comprises metal.

12. The system of claim 1 further comprising:
   a second gas jet apparatus affixed to a second vacuum chamber port for providing controlled gas entry into the interior of the vacuum chamber, said second gas jet apparatus including:
   a second gas jet apparatus nozzle having an interior cavity;
   a second gas jet apparatus means for providing reactant gas to said nozzle interior cavity; and
   a discharge means configured about said second gas jet apparatus for generating a discharge in said reactant gas only in said second nozzle interior cavity.

13. The system of claim 1 wherein said substrate comprises a member selected from the group consisting of silicon, silicon dioxide, phosphate glass, gallium arsenide, metals, ceramics, polytetrafluoroethylene, carbon fiber, plastic and indium phosphide.

14. The system of claim 1 wherein said positioning apparatus further comprises a supply reel and a take up reel and a means for transferring a wire shaped substrate from said supply reel to said takeup reel during deposition.

15. The system of claim 1 wherein said first material comprises at least one organo-metallic compound.

16. A system for depositing a film upon a substrate, said system including a vacuum chamber having a port allowing for access to an interior, an apparatus for receiving a substrate positioned within said vacuum chamber interior and a pump means for evacuating gas from said vacuum chamber, a gas jet apparatus having an interior cavity and affixed to said vacuum chamber port, said gas jet apparatus comprising:
   a means for providing carrier gas to said gas jet apparatus interior cavity at a pressure greater than a pressure in said vacuum chamber;
   a nozzle tip at a distal end of said gas jet apparatus extending into said vacuum chamber interior for providing a supersonic jet of gas directly to an outer surface of said substrate,
   an evaporation means configured within said gas jet apparatus interior cavity registered with and inwardly displaced from said nozzle tip into said gas jet apparatus interior cavity, said evaporation means for evaporating material stored in said evaporation means; and
   a means for providing reactant gas to said gas jet downstream from said evaporation means and prior to said gas jet impacting said substrate outer surface.

17. The apparatus of claim 16 wherein said nozzle further is in registration with a substrate upper surface.

18. The apparatus of claim 17 wherein said nozzle is centrally positioned within said gas jet apparatus interior cavity.

19. The apparatus of claim 16 wherein said nozzle comprises tubular chemical and heat resistant glass.

20. The apparatus of claim 17 wherein said nozzle tip is circular.

21. The apparatus of claim 17 wherein said nozzle tip has a substantially elongated cross sectional profile.

22. The gas jet apparatus of claim 16 further comprising a translation mechanism for moving said substrate positioning apparatus between a first and a second position.

23. The gas jet apparatus of claim 22 wherein said translation apparatus further comprises a mechanism for rastering said substrate positioning apparatus with respect to said nozzle tip, thereby presenting substantially all of said substrate surface to be in registration with said nozzle tip.

24. A system for depositing a film upon a substrate, said system comprising:
   a vacuum chamber having a plurality of ports allowing for access to an interior of said vacuum chamber,
   a translation fixture for receiving a substrate positioned within said vacuum chamber interior and for moving said substrate between first and second positions;
   a first gas jet apparatus having an interior cavity and affixed to a first vacuum chamber port, including:
   a means for providing carrier gas to said gas jet apparatus interior cavity at a pressure greater than a pressure in said vacuum chamber;
   a first gas jet apparatus nozzle tip at a distal end of said first gas jet apparatus extending into said vacuum chamber interior for providing, at said first position, a supersonic jet of gas directly to an outer surface of said substrate; and a first evaporation means configured within said first gas jet apparatus interior cavity registered with and inwardly displaced from said first gas jet apparatus nozzle tip into said first gas jet apparatus interior cavity, said first evaporation means for evaporating a first material stored in said evaporation means;

a second gas jet apparatus having an interior cavity and affixed to a second vacuum chamber port, including:

a means for providing carrier gas to said second gas jet apparatus interior cavity at a pressure greater than a pressure in said vacuum chamber;

a second gas jet apparatus nozzle tip at a distal end of said second gas jet apparatus extending into said vacuum chamber interior for providing at said second position, a supersonic jet of gas directly to said outer surface of said substrate; and a second evaporation means configured within said second gas jet apparatus interior cavity registered with and inwardly displaced from said second gas jet apparatus nozzle tip into said second gas jet apparatus interior cavity, said second evaporation means for evaporating a second material stored therein; and a pump means for evacuating gas from said vacuum chamber;

said translation fixture being capable of moving said substrate between said first and second positions at a speed sufficient to ensure the substrate film is comprised of chemical reaction products of said first and second evaporated materials.

25. A system for depositing a film upon a substrate, said system comprising:

a vacuum chamber having a plurality of ports allowing for access to an interior of said vacuum chamber, a translation fixture positioned within said vacuum chamber interior for receiving a substrate and for moving said substrate between a first position and a second position;

a first gas jet apparatus having an interior cavity and affixed to a first vacuum chamber port, including:

a means for providing carrier gas to said gas jet apparatus interior cavity at a pressure greater than a pressure within said vacuum chamber;

a first gas jet apparatus nozzle tip at a distal end of said first gas jet apparatus extending into said vacuum chamber interior for providing, at said first position, a supersonic jet of gas directly to an outer surface of said substrate; and an evaporation means configured within said first gas jet apparatus interior cavity registered with and inwardly displaced from said first gas jet apparatus nozzle tip into said first gas jet apparatus interior cavity, said evaporation means for evaporating material stored in said evaporation means;

a second gas jet apparatus affixed to a second vacuum chamber port for providing controlled gas entry into the interior of the vacuum chamber, said second gas jet apparatus including a second gas jet apparatus nozzle having an interior cavity for providing a supersonic jet of reactant gas directly towards said substrate second position; and a pump means for evacuating gas from said vacuum chamber;

wherein said translation moves said substrate between said first and second positions within a time less than a time needed to complete film formation on said substrate to ensure that a film deposited on said substrate is chemically comprised of chemical reaction products of said material and said reactant gas.

26. The system of claim 25 wherein said second gas jet apparatus further comprises a discharge means configured about said second gas jet apparatus for generating a discharge in said reactant gas only in a portion of said second gas jet apparatus interior cavity.

27. The system of claim 25 wherein said translation fixture comprises a means for heating said substrate.

28. The system of claim 25 wherein said translation fixture includes a surface for mounting said substrate substantially perpendicular to a direction of said reactant gas jet and rotatable about an axis substantially parallel to said substrate plane.

29. The system of claim 25 wherein said translation fixture includes a surface for mounting said substrate substantially perpendicular to a direction of said gas jets and is displaceable relative thereto.

30. The system of claim 25 wherein said second gas jet apparatus further comprises a means for providing a second reactive gas.

31. The system of claim 25 wherein said substrate comprises a member selected from the group consisting of silicon, silicon dioxide, phosphate glass, gallium arsenide, metals, ceramics, polytetrafluoroethylene, carbon fiber, plastics and indium phosphide.

32. The system of claim 25 wherein said reactant gas comprises a member selected from the group consisting of $SiH_4$, $SiH_2Cl_2$, $SiCl_4$, $SiF_4$, $WF_6$, $TiCl_4$, $BCl_3$, $B_2H_6$, $GeH_4$, $AsH_5$, $C_2H_2$, and $W(CO)_6$.

33. The system of claim 25 wherein said reactive gas is an organo-metallic vapor.

34. The system of claim 25 wherein said translation fixture further comprises a supply reel and a take up reel and a means for transferring a wire shaped substrate from said supply reel to said takeup reel during deposition.

35. A system for depositing a film upon a substrate, said system comprising:

a vacuum chamber having a plurality of ports allowing for access to an interior of said vacuum chamber;

a translation fixture positioned within said vacuum chamber interior for receiving said substrate and for moving said substrate between a first position, a second position and a third position;

a first gas jet apparatus having an interior cavity and affixed to a first vacuum chamber port, including a means for providing carrier gas to said gas jet apparatus interior cavity at a pressure greater than a pressure in said vacuum chamber;

a first gas jet apparatus nozzle tip at a distal end of said first gas jet apparatus extending into said vacuum chamber interior for providing a supersonic jet of gas directly to an outer surface of said substrate at said first position;

an evaporation means configured within said first gas jet apparatus interior cavity registered with and inwardly displaced from said first gas jet apparatus nozzle tip into said first gas jet apparatus interior cavity, said evaporation means for evaporating material stored in said evaporation means;

a second gas jet apparatus affixed to a second vacuum chamber port for providing controlled gas entry into the interior of the vacuum chamber, said second gas jet apparatus including a second gas jet apparatus nozzle having an interior cavity for providing a supersonic jet of a first reactant gas directly towards said substrate at said second position:

a third gas jet apparatus affixed to a third vacuum chamber port for providing controlled gas entry into the interior of the vacuum chamber, said third gas jet apparatus including a third gas jet apparatus outer nozzle having an interior cavity;

a third gas jet apparatus means for providing carrier gas within said third gas jet apparatus outer nozzle interior cavity;

a third gas jet apparatus inner nozzle located within said third gas jet apparatus interior cavity for providing, at said third substrate position, a supersonic jet of a second reactant gas from a third gas jet apparatus inner nozzle tip;

a discharge means configured about said third gas jet apparatus for generating a discharge in said carrier gas and said second reactant gas only in a portion of said third gas jet apparatus outer nozzle interior cavity extending from approximately from said third gas jet apparatus inner nozzle tip towards said vacuum chamber; and a pump means for evacuating gas from said vacuum chamber:

wherein said translation fixture further moves said substrate between said first, second and third positions within a time less than a time needed to complete film formation on said substrate to ensure that a film deposited on said substrate is chemically comprised of chemical reaction products of said material and said first and second reactant gasses.

36. A method for depositing a film upon a substrate, said method comprising the steps of:

providing a vacuum chamber having a port allowing for access to a vacuum chamber interior, positioning a substrate within said vacuum chamber interior;

providing controlled entry of a carrier gas into the interior of the vacuum chamber at a pressure greater than a pressure in said vacuum chamber by means of a gas jet apparatus having an interior cavity and being affixed to said vacuum chamber port, providing a supersonic jet of gas directly to an outer surface of said substrate by means of a gas jet apparatus nozzle tip extending into said vacuum chamber interior;

evaporating material stored in an evaporation means configured within said gas jet apparatus interior cavity registered with and inwardly displaced from said gas jet apparatus nozzle tip into said first gas jet apparatus interior cavity;

providing a first reactant gas to said gas jet downstream from said evaporation means prior to said gas jet impacting said substrate outer surface and evacuating gas from said vacuum chamber to maintain a pressure in said vacuum chamber.

37. The method of claim 36 further comprising the steps of moving said substrate between a first position and a second position.

38. The method of claim 37 further comprising the steps of:

providing controlled entry of a second reactant gas into an interior cavity of a nozzle of a second gas jet apparatus affixed to a second vacuum chamber port directly towards said substrate; and generating a discharge in said second reactant gas only in a portion of said gas jet apparatus nozzle interior cavity extending from approximately said nozzle tip.

39. The method of claim 38 further comprising the steps of moving said substrate between said first and second positions within a time less than a time needed to complete film formation on said substrate, thereby ensuring the substrate film is chemically comprised of said evaporated material and said first and second reactant gases.

* * * * *